US008862446B1

(12) United States Patent
Balasubramanian

(10) Patent No.: US 8,862,446 B1
(45) Date of Patent: Oct. 14, 2014

(54) SYSTEMS AND METHODS FOR GRAPHICAL MODEL ENVIRONMENT ROUTING

(75) Inventor: Krishna Balasubramanian, West Roxbury, MA (US)

(73) Assignee: The MathWorks, Inc., Natick, MA (US)

( * ) Notice: Subject to any disclaimer, the term of this patent is extended or adjusted under 35 U.S.C. 154(b) by 781 days.

(21) Appl. No.: 12/404,106

(22) Filed: Mar. 13, 2009

Related U.S. Application Data

(60) Provisional application No. 61/092,319, filed on Aug. 27, 2008.

(51) Int. Cl.
G06G 7/48 (2006.01)
G06F 17/50 (2006.01)

(52) U.S. Cl.
USPC ................................................ 703/6; 703/13

(58) Field of Classification Search
USPC ..................................... 703/2, 6, 13
See application file for complete search history.

(56) References Cited

U.S. PATENT DOCUMENTS

| 7,877,248 | B1 * | 1/2011 | Clune | 703/13 |
| 2007/0073421 | A1 * | 3/2007 | Adra | 700/36 |
| 2008/0040703 | A1 * | 2/2008 | Englehart | 717/104 |
| 2009/0093969 | A1 * | 4/2009 | Ladd et al. | 702/19 |
| 2009/0141637 | A1 * | 6/2009 | Bauer et al. | 370/238 |
| 2010/0153910 | A1 * | 6/2010 | Ciolfi et al. | 717/105 |
| 2010/0175045 | A1 * | 7/2010 | Ciolfi et al. | 717/105 |

OTHER PUBLICATIONS

SIMULINK (Model-Based and System-Based Design, Version 4, 2000).*

* cited by examiner

*Primary Examiner* — Kamini S Shah
*Assistant Examiner* — Andre Pierre Louis
(74) *Attorney, Agent, or Firm* — Harrity & Harrity, LLP

(57) ABSTRACT

In an embodiment, a computer readable medium that stores computer executable instructions is provided. The computer readable medium includes instructions for displaying a graphical model representing a modeled system, the graphical model having a first element and a second element. The computer readable medium includes instructions for identifying, in response to a request to connect at least one of the first element and the second element with a signal, a routing path within the graphical model. The routing path can be mapped through at least one subsystem of the modeled system and configured to logically connect the first element with the second element. The computer readable medium includes instructions for logically connecting, in the graphical model, the first element and the second element via the routing path.

25 Claims, 13 Drawing Sheets

000
SYSTEMS AND METHODS FOR GRAPHICAL MODEL ENVIRONMENT ROUTING

BACKGROUND INFORMATION

Graphical modeling environments enable interactive design, testing, and implementing of a variety of time-varying systems, including communication, control, signal processing, video processing, and image processing systems. A graphical model of a dynamic system can be represented as a collection of blocks interconnected by lines. These lines may represent signals. Blocks represent elements in the dynamic system. Signals represent input values and output values of dynamic systems.

Graphical models may include subsystems. A subsystem may contain a group of blocks, signals, and/or other subsystems, and may be represented in a graphical modeling environment as a single block, producing a layered graphical model. Layered graphical models facilitate design management and simulation by segmenting a graphical model into various components. For example, a layer of a graphical model can be represented by a subsystem, and the contents of the subsystem may include blocks and lines that represent another layer of the graphical model.

SUMMARY

According to one aspect, a computer readable medium that includes computer executable instructions is provided. The computer readable medium includes instructions for displaying a graphical model representing a modeled system the graphical model having a first element and a second element. The modeled system may be a real world system, such as a physical system, chemical, mechanical, electrical, biological, or any combination of the above. It may be a dynamic system. A dynamic system is a system whose behavior changes over time. The graphical model may model the dynamic behavior of the underlying system.

The computer readable medium includes instructions for identifying, in response to a request to connect at least one of the first element and the second element with a signal, a routing path from a plurality of potential routing paths. The routing path can be mapped through at least one subsystem of the modeled system and configured to logically connect the first element with the second element. The computer readable medium includes instructions for logically connecting, in the graphical model, the first element and the second element via the routing path.

In various embodiments, the computer readable medium includes instructions for identifying a plurality of potential routing paths between the first element and the second element, and may perform a logic operation to identify a routing path from the plurality of potential routing paths. The graphical model including the first element and the second element may be displayed, and each element may include at least one port connected to at least one bus line. In at least one exemplary embodiment, a first set of potential routing paths from the first element to the second element, and a second set of potential routing paths from the second element to the first element may be identified. In this exemplary embodiment, performing a logic operation to identify the routing path may include at least in part evaluating the first set of potential routing paths and the second set of potential routing paths, where the routing path logically connects at least one of the first element and the second element with the signal via, for example, at least one port and at least one bus line.

In an embodiment the computer readable medium includes instructions for displaying the graphical model including the first element and the second element, creating at least one port associated with at least one of the first element and the second element, and performing a routing operation to logically connect at least one of the first element and the second element with the signal via the port. The computer readable medium may also include instructions for creating a routing path by aggregating a plurality of signals into one of a plurality of bus lines.

In one embodiment the computer readable medium includes instructions for determining a number of intervening elements logically located between the first element and the second element for each of a plurality of potential routing paths. Performing the logic operation to identify a routing path may include identifying a routing path as one of the plurality of potential routing paths having a least number of intervening elements. In various embodiments, the computer readable medium can include instructions for identifying a dead path logically connected to at least one intervening element, and removing the dead path or the at least one intervening element from the graphical model. At least one exemplary embodiment may also include receiving a command to include at least one intervening element in a routing path.

According to another aspect, a computer system is provided that includes a simulation engine configured to execute a graphical program representation, the graphical program representation having a plurality of elements including a first element and a second element. The simulation engine is configured to identify a routing path that includes at least one subsystem of the graphical program representation, the routing path logically connecting the first element and the second element in response to a command to connect at least one of the first element and the second element with a signal. The computer system can include an interface configured to display the routing path of the graphical program representation.

According to another aspect, an apparatus for executing a graphical program representing a modeled system is provided. The apparatus includes a simulation engine configured to execute the graphical program and to identify a plurality of paths logically connecting a signal and a first element in the modeled system. The apparatus includes means for identifying a routing path from the plurality of paths, where the routing path includes at least one subsystem of the modeled system. The apparatus includes an interface configured to display the routing path of the modeled system.

In various embodiments, the simulation engine may identify one of a plurality of potential routing paths as the routing path, and the simulation engine may create, in response to a command, at least one routing port associated with one of a first element and a second element. In one embodiment, the first element forms part of a first hierarchical layer of graphical program representation, and the second element forms part of a second hierarchical layer of the graphical program representation. In an embodiment, the routing path may be identified as a path including at least one routing port. In another embodiment, the simulation may be configured to identify at least one intervening element logically located between a first element and a second element, and the simulation engine may be configured to receive a command to include the intervening element in the routing path. In one embodiment, at least one subsystem of the routing path can include a portion of the routing path that is configured to route a signal from a first hierarchical layer of the graphical program representation to a second hierarchical layer of the graphical program representation.

According to one aspect, a computer implemented method is provided that includes receiving a command to connect at least one of a first element of the modeled system and a second element of the modeled system with a signal. The computer implemented method performs a logic operation to identify a routing path between the first element and the second element. The routing path can include at least one subsystem of the modeled system. A routing operation can be performed in the graphical model to logically connect at least one of the first element and the second element with the signal via the routing path, and the computer implemented method can display the graphical model including the routing path.

In various embodiments, the computer implemented method performs a first logic operation to determine a first set of potential routing paths, a second logic operation to determine a second set of routing paths, and the computer implemented method selects the routing path based at least in part on an evaluation of the first set of paths and the second set of paths. The computer implemented method may select a routing path that includes an intervening element. In one embodiment, the computer implemented method displays a plurality of potential routing paths and receives a selection of a routing path, where the routing path is one of the potential routing paths. In one embodiment, performing the routing operation includes generating code to logically connect at least one of the first element and the second element with the signal via the routing path.

According to another aspect, a computer readable medium including computer readable instructions for manipulating a display of a modeled system on an interface is provided. The computer readable medium includes instructions to execute a graphical program representing the modeled system, the modeled system including a first element, and instructions to receive a command to route a signal to the first element. The computer readable medium includes computer readable instructions to identify a routing path logically connecting the signal and the first element, the routing path identified from one of a plurality of potential routing paths, each potential routing path configurable to logically connect the signal with the first element.

In at least one embodiment, the computer readable medium may include instructions for displaying a plurality of potential routing paths, and receiving a selection of the routing path, wherein the routing path includes at least a portion of one or more of the plurality of potential routing paths. In an embodiment the computer readable instructions may include unified modeling language (UML) computer readable instructions and/or instructions in other modeling languages, such as SysML, etc.

Other aspects and advantages of the embodiments disclosed herein will become apparent from the following detailed description, taken in conjunction with the accompanying drawings, illustrating the principles of the invention by way of example only.

BRIEF DESCRIPTION OF THE DRAWINGS

The accompanying drawings, which are incorporated in and constitute a part of this specification, illustrate one or more embodiments consistent with the principles of the invention and, together with the description, explain the invention. In the drawings.

DETAILED DESCRIPTION

Overview

Figure 1:
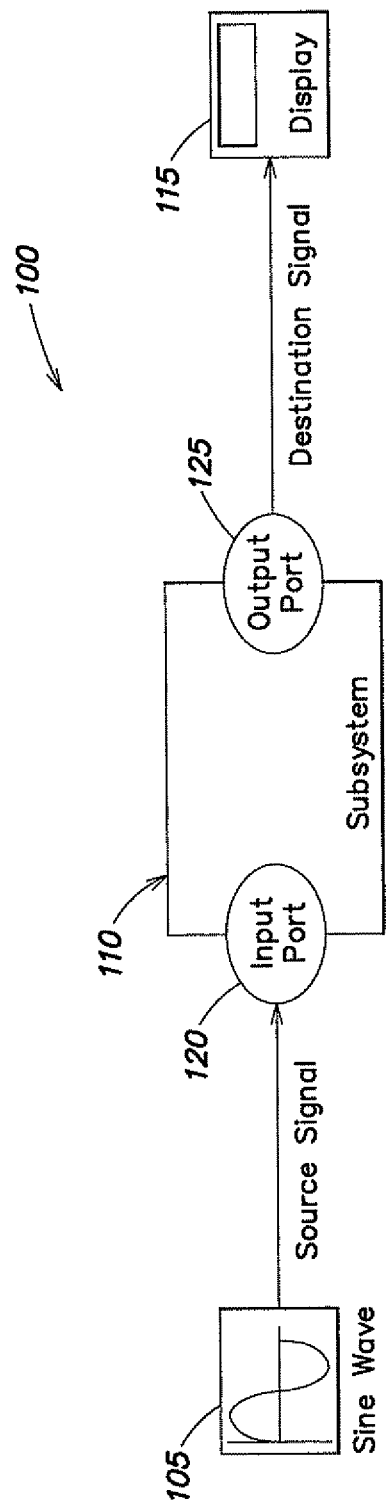
FIG. 1 depicts an example system illustrating a graphical model in accordance with an embodiment.

New signals can be added to graphical models by graphical model designers during model creation, testing or implementation. In an embodiment, a user may use a modeling environment user interface to introduce a signal that begins at one block of a graphical model and is intended to lead to a different block of the graphical model. Because complex graphical models may include a large number of blocks and subsystems, a routing path from the start point to its end point may not be readily apparent. For example, the layered nature of subsystems may obscure blocks from view, or a plurality of blocks and lines may provide more than one potential route for a signal. In some models, there may already be a path from a source block to a destination block through one or more buses; in other models, there may be no such path, or only a partial path may exist.

Graphical models may have extensive, multiple-layered hierarchies. Manually routing signals through layers of a graphical model may be time consuming and error prone, as many potential routing paths may exist, and some may be more efficient or direct than others. For example, unnecessarily routing a signal through superfluous blocks may increase editing effort, model execution time, compilation time, and/or may decrease graphical model response time. Attempting to introduce and route a signal from one layer of a graphical model to another layer may be a tedious trial-and-error process that increases graphical model design time and can delay implementation of a graphical model.

In an embodiment, a routing path between two points of a graphical model may be identified by a modeling environment. For example, the modeling environment may analyze the relationships between blocks and signals—represented as lines in a graphical model—to identify an existing routing path connecting two points of the graphical model. Such path may include one or more buses present in the graphical model. A bus may be a construct that includes one or more signals. In one embodiment, analyzing to find an existing path may include analyzing block functionality and line connections from a point at which a signal is introduced to a point at which the data it carries is used. In another embodiment, identifying a routing path may include analyzing block functions and line connections in the opposite direction, from the signal's destination to its source.

In an embodiment, blocks or lines may be introduced to a graphical model in order to create a routing path between two points. For example, bus creators and/or selectors, inputs and/or outputs may be added to a subsystem to provide a routing path for a signal that connects different layers of a graphical model or a signal that passes through different layers of a graphical model. In order to route the signal, a new connection may be created between two or more blocks, and/or a new bus may be added to the model.

In an embodiment, a plurality of potential routing paths for a signal may be identified. Out of the plurality of the routing paths, a single routing path may be chosen either automatically by the modeling environment, or with the input from the user. One of the plurality of routing paths may be identified as being, for example, more efficient or more direct than the other potential routing paths.

Various aspects and embodiments described herein may provide effective signal routing in a graphical model environment. The systems and methods according to various embodiments can perform logic operations to identify a routing path for a signal between two or more elements in a model, and can perform logic operations to connect the elements. Automatic routing may reduce errors associated with manual signal routing, increase efficiency and robustness of a design, and/or lower cost of the design.

Exemplary System

FIG. 1 is a representation of an exemplary system 100 illustrating a graphical model in accordance with an embodiment. System 100 may include sine wave generator block 105, subsystem block 110, and display block 115 that displays the input provided to it. Subsystem 110 may include at least one input port 120 and at least one output port 125. As illustrated in FIG. 1, sine wave block 105 may generate a sine wave as a source provided to subsystem 110 via input port 120. Output port 125 of subsystem 110 may output data that is provided as a destination to display 115. Some blocks may be virtual blocks and may be included in system 100 as a graphical convenience but that may not produce output and/or affect computation during simulation. In this example, sine wave block 105 may be not a virtual block, as sine wave block 105 may generate and provide a sine wave as output during simulation. In various models, there may be numerous blocks, whether producing data to be consumed by other blocks or/and displaying data on a display. There may be multiple signals connecting these blocks. There may also be one or more bus signals. As used herein, the terms "source" and "destination" refer to the routing of signals in a path, and not necessarily to the computation of the blocks in the path.

Paths in a graphical model may be thought of as geometric paths, topological paths and/or logical paths. A geometric path is a path that indicates graphical coordinates of where the path is drawn. A topologic path is a path that includes graphical elements of the model, such as ports, blocks, layers, connections, buses, etc., that it relates to. A logical path is a path that includes a destination, its logical source and intervening logical sources in the path.

Figure 2:
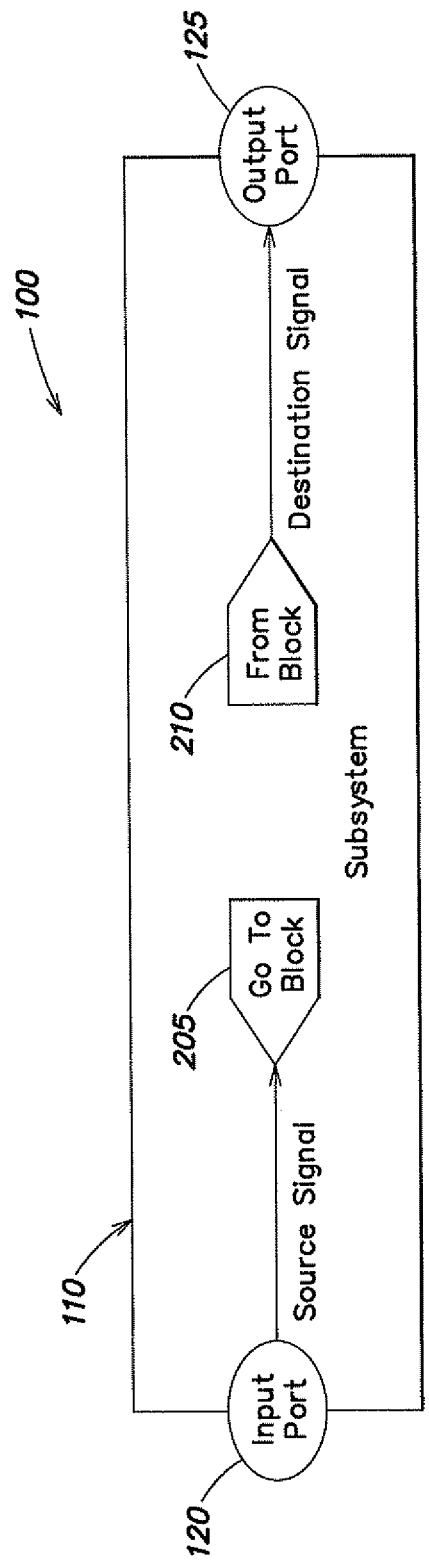
FIG. 2 depicts an example system illustrating a subsystem in a graphical model in accordance with an embodiment.

FIG. 2 is a representation of exemplary system 100 illustrating subsystem 110 in accordance with an embodiment. The source signal as illustrated may be provided from input port 120 to GoTo block 205, which may direct the source signal to connect to From block 210, where the signal can be received. The GoTo and/or From blocks may be used to allow users to connect blocks together without drawing signal lines. Block 210 may provide the destination signal to output port 125. Blocks, such as those illustrated in FIGS. 1 and 2, may have graphical sources, and various embodiments include other blocks with functions different than those of GoTo block 205 and From block 210. In an embodiment, a graphical source of a particular block includes a graphical upstream block connected to that particular block by a line. In various embodiments, graphical sources of any block may or may not include virtual blocks. The Goto and From blocks are used in FIG. 2 to illustrate that blocks do not have to be connected by wires to have graphical sources. For example, the From block 210 does not have an incoming signal, yet its graphical source is block 205. Such interconnections may make it more difficult for users to identify valid logical paths in a model. A logical connection is a connection where a source block provides data to a destination block.

Blocks may also have logical sources. In an embodiment, a logical source of a particular block can be a graphical upstream block that produces or generates the output that is consumed by or provided to that particular block. A logical source of a block may, but need not be the same as the graphical source of that block, as a signal produced by a logical source may pass through more than one virtual blocks. For example and as illustrated in FIGS. 1 and 2, the sine wave signal produced by logical source sine wave block 105 can pass through input port 120, GoTo block 205, From block 210, and output port 125 before being provided as a destination signal to display 115. Thus, in an embodiment, From block 210 is the graphical source block of output port 125, whereas sine wave block 105 is the logical source block of output port 125. This example illustrates that there may be a difference between a graphical source and a logical source for a block in some models. For example, for block 210, the graphical source is block 205, but the logical source is block 105. Blocks 205 and 210 in the illustrated model do not change the signal; they are used as graphical conveniences to avoid drawing extra signal lines.

In an embodiment, a user indicates a desire to connect two blocks—a source and a destination—by a signal. A routing path from an intended source to a destination of a graphical model can be determined by a modeling environment. In some models, there may already be an existing path from the source block to the destination block that may be used to add a signal. In various embodiments, a routing path may be identified by traversing the signal path from its destination point to its potential source. For example, such an existing path may be located by first identifying a graphical source of a destination block. If the graphical source is the logical source of the signal provided to the destination block, then the logical source has been located and a routing path identified. If the graphical source is not the logical source of the signal provided to the destination block (e.g., the graphical source is a virtual block), then a graphical source of the first graphical source can be identified and evaluated to see if it is the logical source of the intended destination block. Successive graphical sources may be evaluated in this iterative manner until a logical source or an entire routing path from the source to the destination has been identified.

Figure 3:
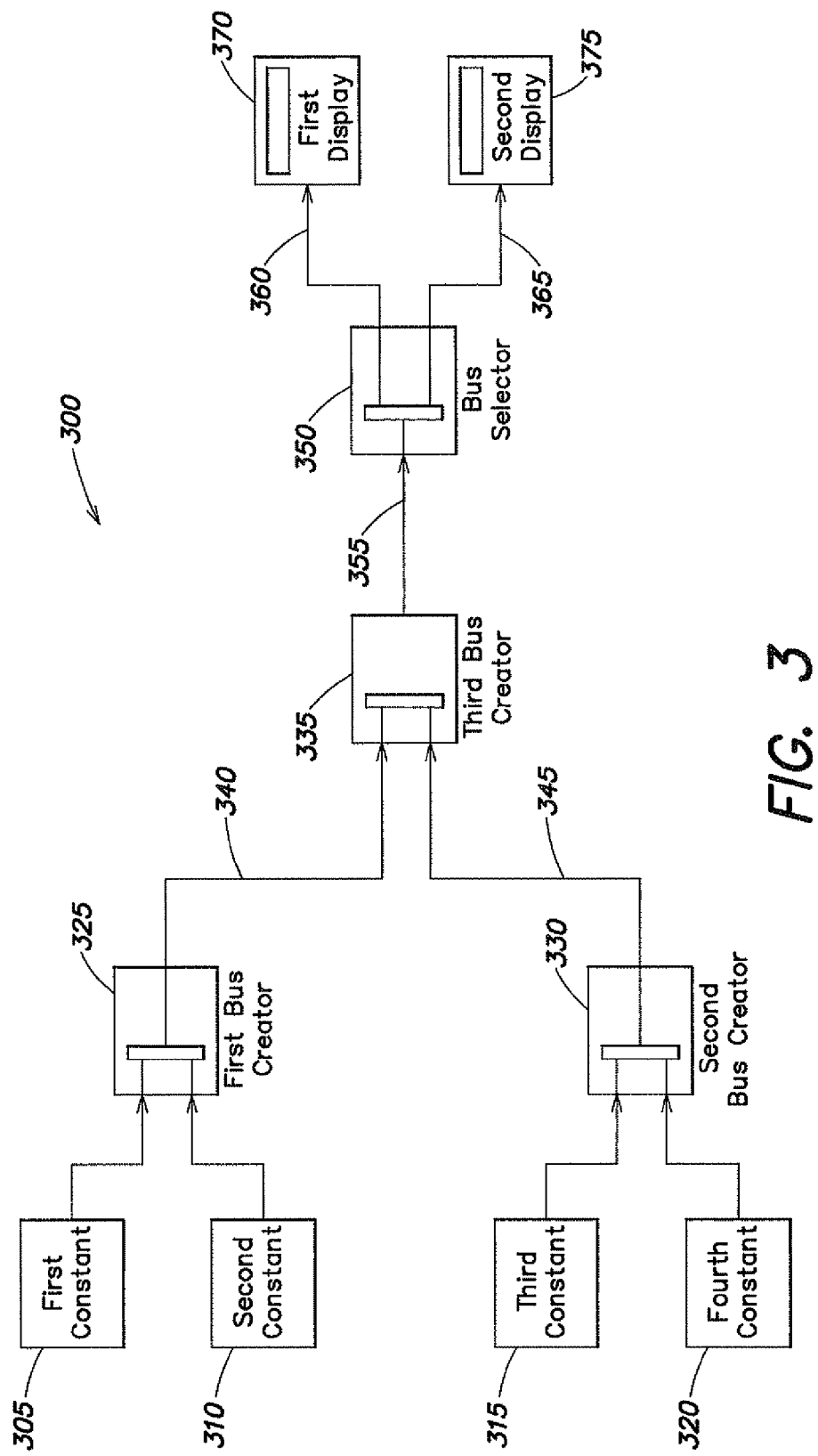
FIG. 3 depicts an example system illustrating a graphical model in accordance with an embodiment.

In some graphical models, one or more virtual blocks or subsystems may be encountered during the search for a routing path. The virtual blocks and/or subsystems may be traversed by the modeling environment in order to locate an efficient routing path. For example, and with reference to FIGS. 1 and 2, the logical source of the destination signal provided to display 115 is sine wave block 105. Beginning with display 115, which is the destination point of the destination signal in this example, system 100 can be traversed to find this logical source. For example, as illustrated in FIGS. 1 and 2, the graphical source of display 115 is output port 125 of subsystem 110, which may be considered to be simply subsystem 110. Continuing with this example, the graphical source of output port 125 is From block 210, and the graphical source driving From block 210 is GoTo block 205. Continuing to traverse the destination signal upstream toward its logical source, it should be appreciated that the graphical source of GoTo block 205 is input port 120 of subsystem 110, and the graphical source of input port 120 is sine wave block 105, which is, in this example, the logical source of the signal provided to display 115. This example illustrates a recursive walk back through the model starting from display block 115 (the destination) and reaching the sine wave block 105 (the logical source). Such walk back may be recursive or iterative, as determined by one of skill in the art. In some cases, a traversal may go directly from output to input ports, without analysis or consideration of some of the subsystem internals. As can be seen, a traversal through the model may be needed to identify the logical source block. Such traversal may be difficult to accomplish by the user. In an embodiment, a traversal is performed by a processor connected to a memory and to a display FIG. 3 is a representation of an exemplary system 300 illustrating a graphical model in accordance with an embodiment. System 300 is a graphical model that includes first constant block 305, second constant block 310, third constant block 315, and fourth constant block 320. In one embodiment, each of constant blocks 305-320 are logical source blocks that provide different signals to various elements of system 300. System 300 also includes first bus creator block 325, second bus creator block 330, and third bus creator block 335. A bus creator block may be a virtual block used to combine two or more signals into a single bus. The combination performed at the virtual bus creator is a virtual one—it is usually done for model readability and convenience; the actual signals that are combined into a bus are not affected by the combination. Virtual bus creator blocks such as those of FIG. 3 can provide a bus to carry a signal from one or more sources. For example, first bus creator 325 may receive signals from first constant 305 or second constant 310 as input, and may provide both of these signals to third bus creator 335 via first bus line 340. In another example, second bus creator 330 may receive signals from third constant 315 or fourth constant 320, and may provide both of these signals to third bus creator 335 via second bus line 345. As illustrated in FIG. 3, third bus creator 335 can therefore receive signals from any of first constant 305 or second constant 310 (via first bus line 340), as well as from any of third constant 315 or fourth constant 320 (via second bus line 345). In an alternative embodiment, the bus creator need not be virtual. The bus creator may perform operations on signals with regards to their implementation. For example, it may line up its signals in memory.

Continuing with this illustrative embodiment, third bus creator 335 may then provide signals originating from any of constants 305-320 to bus selector 350 via third bus line 355. In one embodiment, bus selector blocks such as bus selector 350 can select a signal from a source and provide the signal to one or more destinations. A bus selector block may be a mechanism by which one or more signals are decoupled from a bus. For example, bus selector 350 may select a signal from third bus line 355 and may provide it to first display 370 or second display 375 (i.e., signal 360 or 365, as shown in FIG. 3).

In an embodiment, a logical source block that produces a signal may not be readily perceived by a user because of the graphical representations of bus creator blocks and bus selector blocks, which can join and separate various bus lines. For example, block 370 has a logical source that is one of constant blocks 305, 310, 315, and 320. A user may find it problematic to identify the true logical source. As another example, either third constant 315 or fourth constant 320 may be the logical source block of a signal received by third bus creator 335 on second bus line 345. Bus creator and bus selector blocks may be virtual blocks that do not act as logical sources, but that may complicate finding the logical sources of destination blocks. Thus, a user may use an embodiment to locate a routing path from a source block to a destination block. The user may also use an embodiment to locate a path from a destination block back to a source block. In an embodiment, the routing path may be located by a processing device using a search algorithm to navigate the model.

A signal route may be identified by traversing a signal path from a destination point to its logical source. The traversal may involve performing the following actions:

1) Finding a graphical source of a block;
2) Identifying whether the graphical source is a virtual block;
3) If the graphical source is not a virtual block, then the graphical source may be identified as a logical source as well;
4) If the graphical source is a virtual block, actions (1)-(4) may need to be recursively repeated to locate a logical source of the current graphical source.

In such a way, the logical source may be located through one or more iteration. Once the logical block is located, it may be considered to be the logical source of the entire chain of blocks, starting from the destination block, that have been considered in the process of locating the logical source.

Therefore, in the example illustrated in FIG. 3, the logical source block of bus selector 350 is third bus creator 335; the logical source block of third bus creator 335 is first bus creator 325 and second bus creator 330; the logical source block of first bus creator 325 is first constant 305 and second constant 310; and the logical source of second bus creator 330 is third constant 315 and fourth constant 320.

In some models, there may not be an existing path from a source block to an intended destination block. In an embodiment, a model may be analyzed to determine which buses and/or signals to add, if any, in order to create a routing path between the source and destination blocks. For example, there may not be a bus creator at or near the location where a user intends to introduce a signal. In some models, there may be a bus creator in a different subsystem. In that case, bus creators and/or selectors and structure of associated buses may be identified even in subsystems not including the destination block. These bus structures may then be evaluated, for example by walking through the blocks and lines that form the bus structures, and a bus line may be added between one or more bus creators in the non-destination subsystem and the bus selector in the destination subsystem to create a routing path between the source and destination of a signal. Alternatively, a signal may be added to the bus that is represented by the bus line.

Where no routing path exists between the source and destination of a signal, various blocks such as bus creators and bus selectors may be introduced to the graphical model to create a routing path. Further, when a routing path has been identified, additional bus content, for example between bus creators and bus selectors, may be evaluated to identify additional possible routing paths. Additional blocks and/or ports and/or buses can also be added to a graphical model. For example, to create additional bus structures that can also be evaluated to identify additional routing paths. In such a way, a plurality of routing paths may be identified between one source block and one destination block. The paths can be determined from source to destination (forward traversal) or from destination to source (backward traversal). One or more of the plurality of routing paths may be selected by a user, or logic associated with the graphical model may select one or more routing paths.

A graphical modeling environment may provide mathematical functions and/or graphical tools for creating executable models. In one implementation, the graphical modeling environment may provide these functions and/or tools using toolboxes (e.g., toolboxes for signal processing, image processing, data plotting, parallel processing, optimization, etc.). In another implementation, the graphical modeling environment may provide these functions as block sets (e.g., a control system block set). In still another implementation, the graphical modeling environment may provide these functions in another way, such as via a library, etc. The graphical modeling environment may allow a user to create a graphical model using blocks and connections that represent signals. The user may debug and then execute the model to produce one or more simulation results. Embodiments of graphical modeling environments may further allow a user to generate code (e.g., source code) that can be executed on another device, such as a target device.

Figure 4:
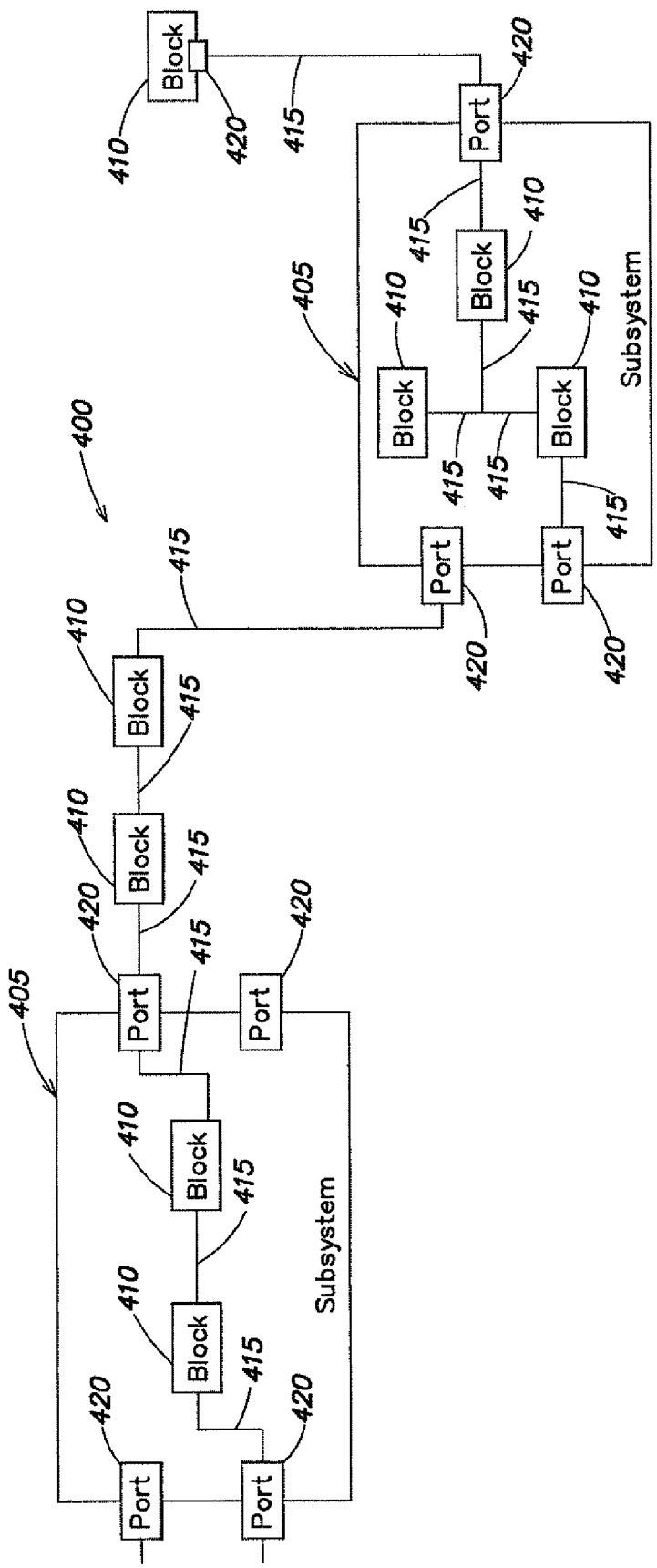
FIG. 4 depicts an example system illustrating a second graphical model in accordance with an embodiment.

FIG. 4 is a representation of an exemplary system 400 illustrating a graphical model in accordance with an embodiment. System 400 may include a plurality of elements such as subsystems 405, blocks 410, lines 415, and ports 420.

Subsystem 405 may include configurable subsystems and/or conditionally executed subsystems. A configurable subsystem may associate two or more design variants with a subsystem within a graphical model. This association may simplify management or creation of graphical models that share blocks 410 or lines 415 that represent more than one design. The two design variants may correspond to a different number of input and output ports of the subsystem. A conditionally executed subsystem may enable or disable elements by, for example, controlling signals in the graphical model. Conditionally executed subsystems may be enabled or triggered based on a particular time, event, or condition.

Subsystems may include other subsystems and/or blocks. An atomic subsystem is a nonvirtual subsystem and may be considered as a block. In such a way, graphical models may include a plurality of hierarchical layers encapsulated by subsystems. For example, a graphical model provided by the Simulink® modeling environment may include any of a number of subsystem types, such as, for example, a Trigger, Enable, Enable with Trigger, Function-Call, Action, For Iterator, or While Iterator subsystem, among others.

In an embodiment, implementations of blocks 410 may be tailored by a user to fit a particular application. For example, this may include blocks 410 that may be partially predefined or not predefined by system 400. Blocks 410 may include virtual blocks that may appear in a graphical model for convenience or display purposes. GoTo blocks, From blocks, or other virtual blocks may need not produce any output when simulations are run on a graphical model that includes them, and a graphical source of a block may be a virtual block. In an embodiment, relationships between signals and state variables may include sets of equations represented by blocks 410. Equations represented by blocks 410 may define a relationship between input or output signals, state, and/or time.

In an embodiment, blocks 410 may be customized by incorporating code into system 400. For example, a user may customize block 410 by incorporating a computer program written in a language such as C, Fortran, Ada, Java, JavaScript, Perl, Assembly, Structured Text, etc., or a Unified Modeling Language (UML). Blocks 410 may also incorporate code written in an array-based programming language. An example of the array-based language is a language compatible with MATLAB© programming environment. Blocks 410, whether predefined or customized, may implement functions for various applications, such as communications, aerospace, hydraulic, signal, video, image, biological, factory, and financial systems.

Figure 5A:
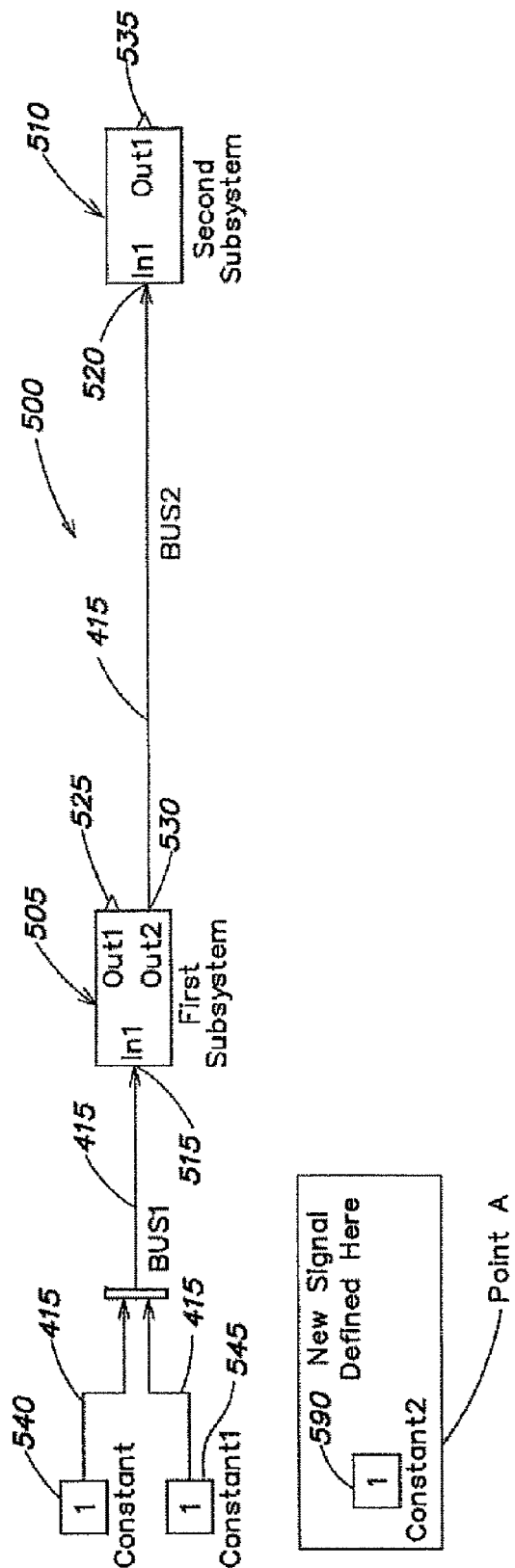
FIGS. 5A-5C depict an example system illustrating a routing problem and contents of a first and a second subsystem of the example system.
Figure 5B:
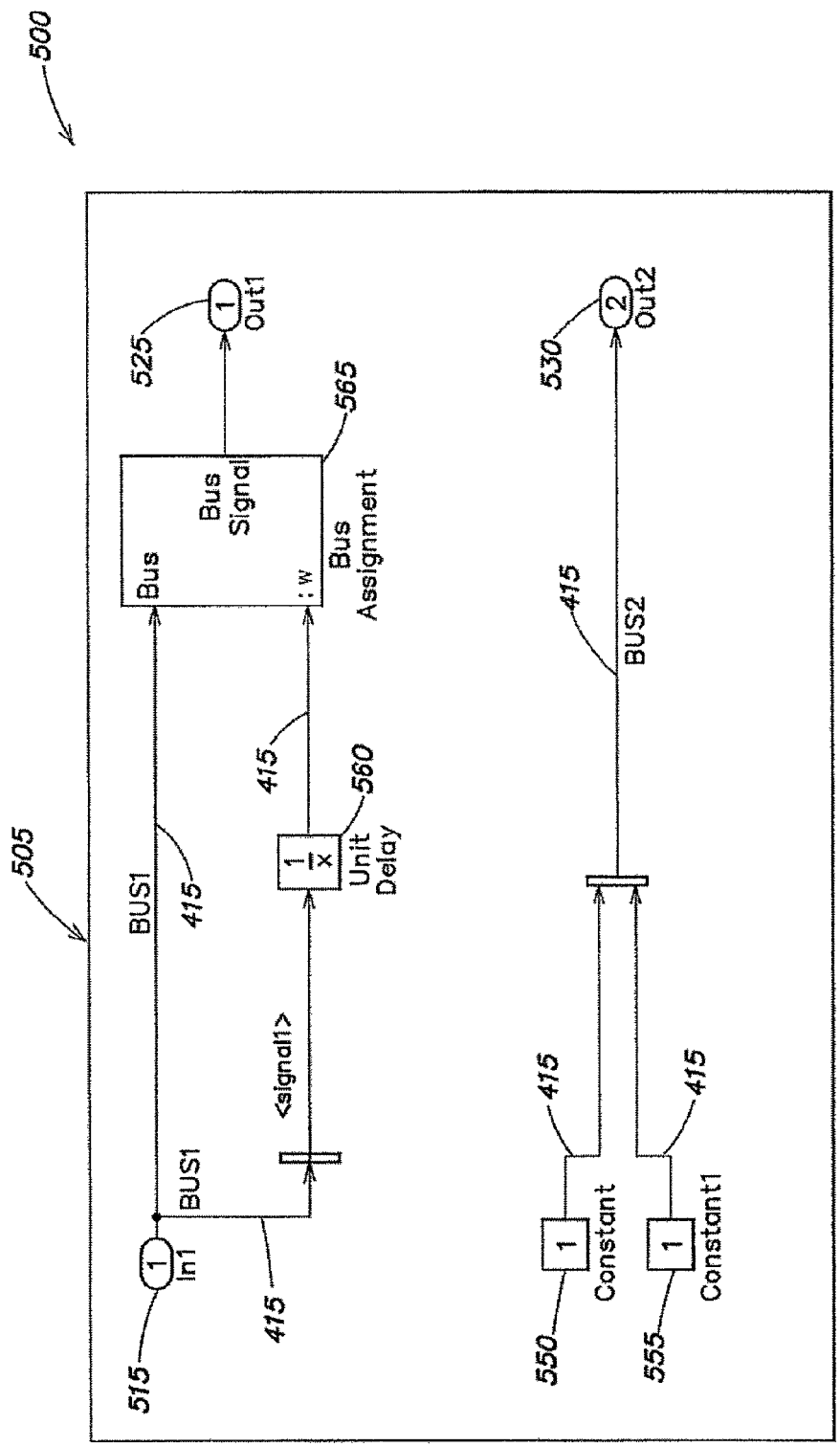
Figure 5C:
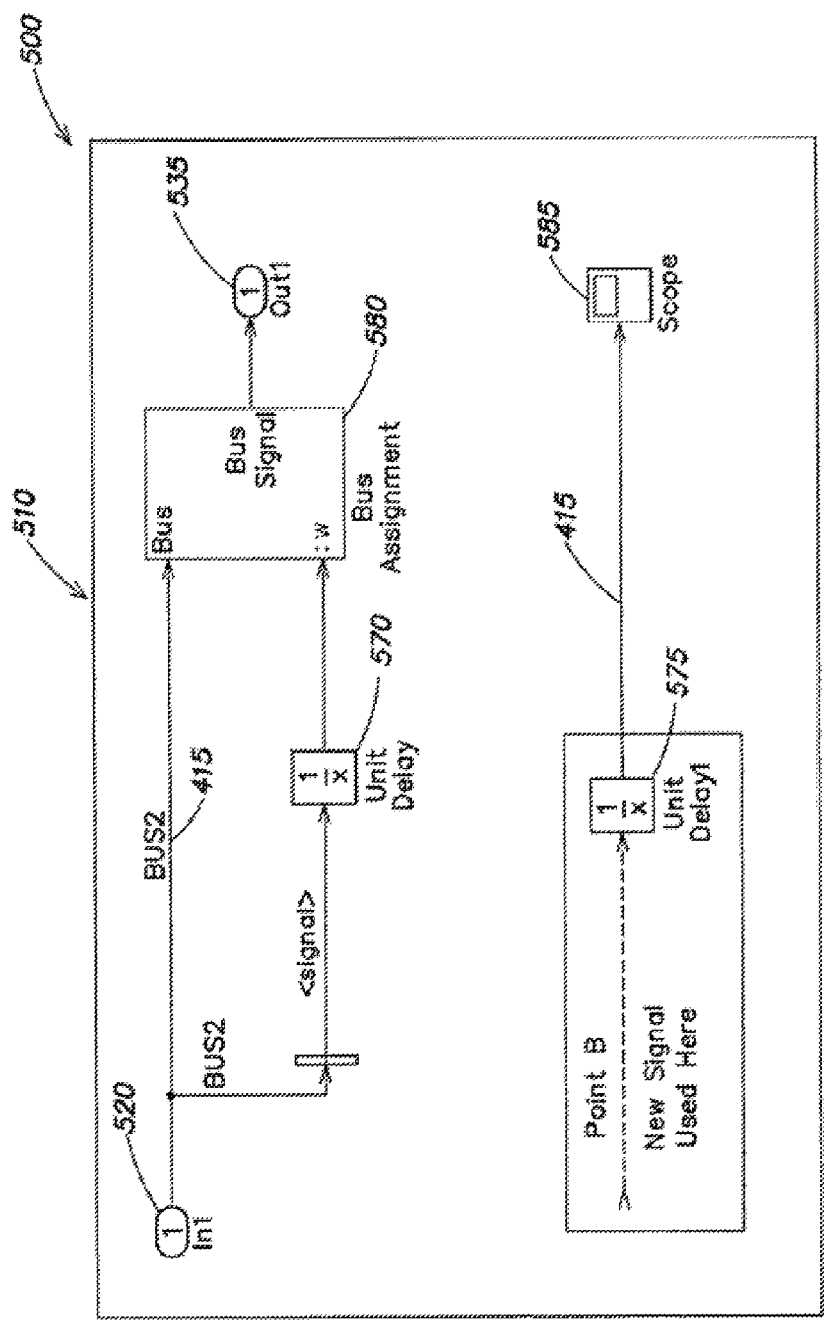

FIGS. 5A, 5B, and 5C depict an example system 500 illustrating a graphical model in accordance with an embodiment of the invention. FIG. 5A includes first subsystem 505 and second subsystem 510 as blocks connected by signals 415, with inputs 515 and 520 and outputs 525, 530, and 535 including port interfaces for signals 415. As illustrated in FIG. 5A, signals from constant input blocks 540, 545 may be provided to first subsystem 505 via line 415 and input port 515. First subsystem 505 may manipulate data available on its input signals and make data available on its output via second output 530. In this illustrative embodiment, line 415 connects output 530 of first subsystem 505 to input 520 of second subsystem 510. Data provided to second subsystem 510 via line 415 may be further manipulated at second subsystem 510 and outputted at output port 535.

FIG. 5B depicts first subsystem 505 where the internal elements are visible. As illustrated in FIG. 5B, first subsystem 505 includes constant blocks 550 and 555, unit delay block 560, and bus assignment block 565. FIG. 5C depicts second subsystem 510 where the internal elements are visible. As illustrated in FIG. 5C, second subsystem 510 includes unit delay blocks 570 and 575, bus assignment block 580, and scope 585.

A user may want to introduce a new signal at some point in a graphical model. For example, the user may want to introduce a new signal at "Point A" as illustrated in FIG. 5A. Constant block 590 may feed data to the new signal at port 420 of first subsystem 505. Data carried by the new signal may be consumed at a destination block in system 500. For example, this destination block may be unit delay block 575 at "Point B," as illustrated in FIG. 5C. In response to user input, the graphical modeling environment may attempt to connect constant block 590 and delay block 575 with a signal or series of signals, such that data from constant block 590 is provided to delay block 575.

A display of system 500 may include first subsystem 505 and second subsystem 510 in their opaque form, and as such the various elements included in these subsystems may not be displayed to a user A path connecting the new signal from one element, (e.g., a source) to another element (e.g., a destination) may or may not be readily apparent to the user. An efficient routing path may pass through one or more layers of the model.

Figure 6A:
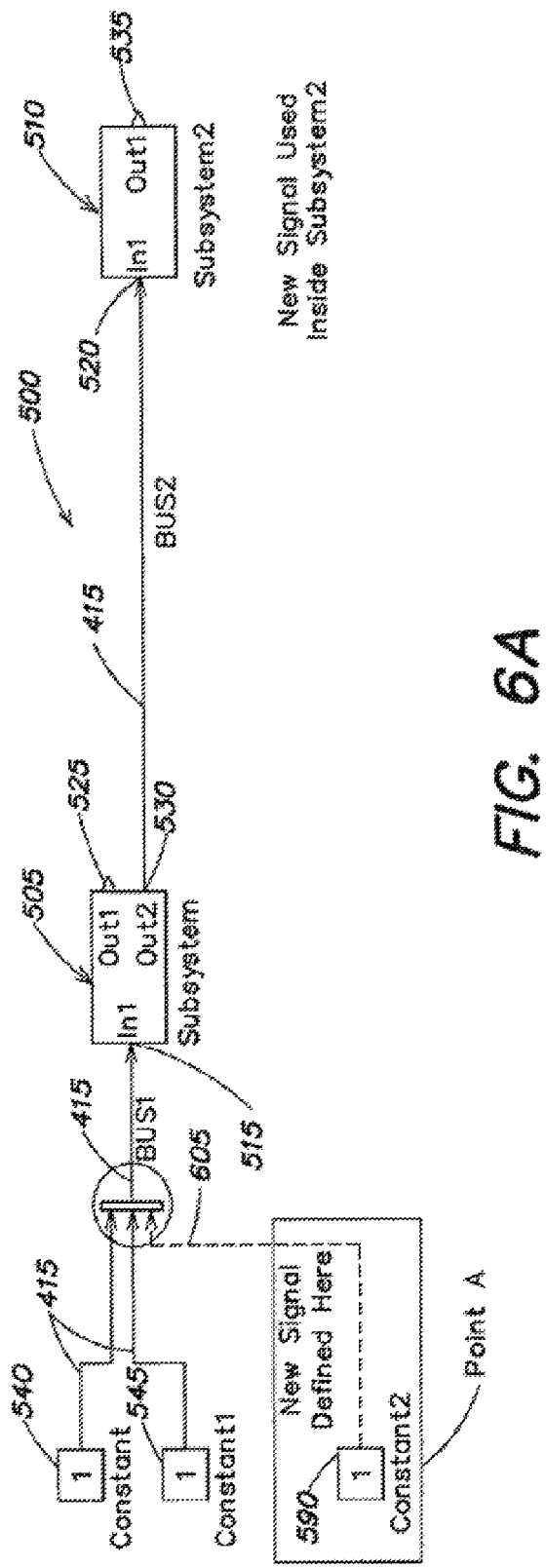
FIGS. 6A-6C depict an example system illustrating a graphical model in accordance with an embodiment and illustrate a route found according to an embodiment.
Figure 6B:
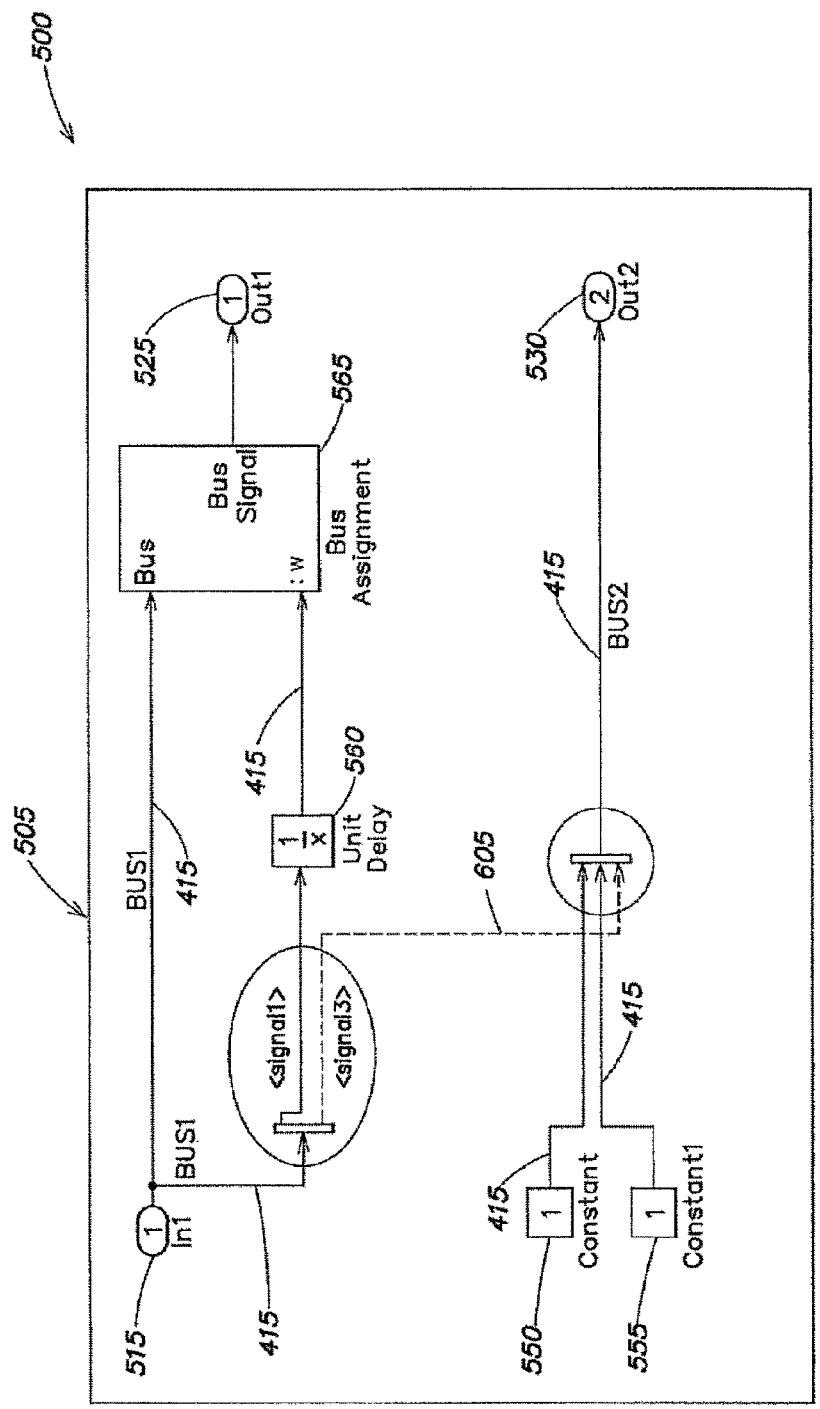
Figure 6C:
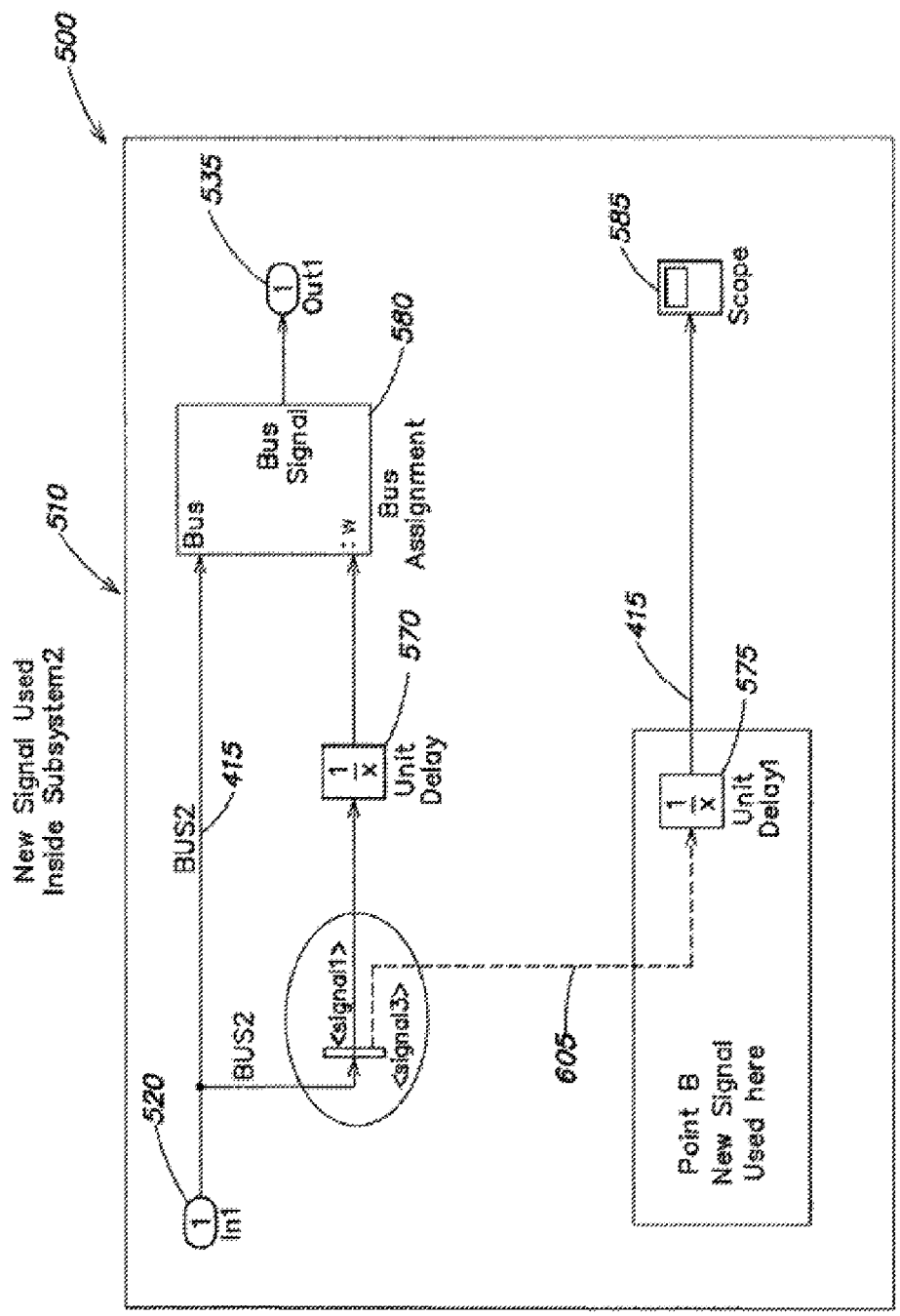

FIGS. 6A-6C include a routing path connecting constant block 590 at "Point A" to unit delay block 575 of second subsystem 510 at "Point B" where the signal may be used by Unit Delay1 575 the output of which may be monitored by scope 585. In order to create the path, new elements, such as line 605 may be added to the graphical model to form all or part of a routing path or potential routing path. For example, as depicted in FIGS. 6A, 6B, and 6C, line 605 may indicate areas where elements may be introduced into a graphical model to create a routing path or potential routing path.

In various embodiments, different elements of a model may be aggregated, added, or moved to various areas of a graphical model to produce a routing path or potential routing path. It should be appreciated that the configuration of first subsystem 505 and second subsystem 510 as illustrated in FIGS. 5A-5C and 6A-6C is an example configuration. Other graphical models may have more, fewer, or different configurations, routing paths, and potential routing paths.

Depending on a particular model, there may be a plurality of potential routing paths, each of which can connect, for example, blocks 410 with a signal represented by line 415. In this illustrative embodiment, a model processing engine may be configured to identify a plurality of potential routing paths.

Routing paths may be identified from at least one of a plurality of potential routing paths, and potential routing paths may not be equal to each other. Some routing paths may be more direct than others. For example, one potential routing path may have fewer intervening blocks 410 between a signal source (e.g., constant block 590 of FIG. 6A) and a destination (e.g., unit delay block 575 of FIG. 6C). A potential routing path may pass through fewer layers of a graphical model, or fewer subsystems 405. In various embodiments, a potential routing path may be identified based on one or more criteria. For example, a potential routing path may be identified that is shorter, more direct, or that passes through or does not pass through a certain line 415, block, 410, or subsystem 405. Further, a particular path may be identified from a plurality of potential routing paths as the routing path based on the one or more criteria. These criteria may include weights to attribute value to particular elements. In various embodiments, a routing path may be identified from a plurality of potential routing paths based in part on user input, logic operations performed by a simulation engine, or a combination thereof. In an embodiment, a model processing engine may also indicate dangling signals, unconnected ports, etc.

In some modeling environments, a routing path can be determined without receiving input from a user other than a command to connect at least one block 410 to an indicated signal. The modeling environment can automatically identify a routing path and route a signal from a source to a destination in response to a command to do so. For example, a graphical user interface (GUI) associated with the modeling environment may include a drop down menu or other interface where a user may click a button with a text display "route signal" or "automatically connect element and signal." Receipt of this user input can cause the graphical model to identify or create a routing path, and to logically connect, for example, at least one block 410 with a signal via the routing path.

One or more algorithms may be implemented to determine a first set of potential routing paths and a second set of potential routing paths. For example, in an embodiment where a routing path connects two blocks 410 with a signal, a modeling engine may "walk" on a path leading from a first block 410 to a second block 410 to determine a first set of potential routing paths by evaluating intervening blocks 410 or lines 415. Analogously, a simulation engine may determine a second set of potential routing paths at least in part by walking from the second block 410 to the first block 410. Various algorithms, such as tree and/or graph search algorithms may be implemented to identify, evaluate or create a plurality of potential routing paths.

Intervening elements, such as block 410, may form parts of a potential routing path. For example, an intervening block 410 may be connected to a source of a signal that may be routed, but may not be connected to the destination where the signal is to be connected. Such an intervening block 410 may form part of at least one dead or a dangling path. A dead path generally includes a path logically connected to the source or the destination of a routing path, but not both and is an incomplete or dangling path. A dead path may include legacy blocks 410 from prior versions of the graphical model, or may include blocks 410 that may not implement any useful functions or logic operations due, for example, to an inefficiently designed graphical model. A dead path may be a set of blocks that are connected with ultimately an unconnected line connected to one of the blocks.

A plurality of potential routing paths may at least partially overlap at one or more points of convergence. These points of convergence may include portions or segments of more than one potential routing path. Points of convergence may be evaluated to determine a routing path from the plurality of potential routing paths. For example, a routing path having the least number of points of convergence with other paths may be the most direct potential routing path connecting at least one block 410 with a signal. Alternatively, a desired routing path may be identified from a plurality of routing paths by evaluating the number of elements in each of the potential routing paths. In yet another implementation, a user or a simulation engine may command that a particular point of convergence form part of the routing path. For example, a point of convergence may include block 410 having a scope that can analyze or measure signal characteristics at a particular location of the graphical model. Routing the signal through a routing path that includes a scope may enable analysis of the signal by the scope.

In order to identify a routing path, bus content of different buses may be recursively loaded into one or more bus selector blocks. Recursively loading a bus structure to a bus selector block may include finding a graphical source of a signal that may be subject to a routing command Logic associated with the graphical model may walk up the bus structure of at least one bus selector to evaluate at least one bus creator element. In FIG. 4, at least a portion of a potential routing path may be found when, for example, a bus creator is identified in subsystem 405 where the subsystem includes the source of a signal that is to be routed. A plurality of bus selector blocks may be inspected based on the source of the signal to be routed. This inspection may identify a bus creator associated with a source of a signal that may be routed. In various embodiments, evaluation of bus selector blocks of subsystem 405 can identify a bus creator associated with any of a routing path, potential routing path, transition point between bus lines, or points of convergence between two or more routing paths. If, for example, a first subsystem 405 does not include any selector blocks associated with a bus creator, logic associated with the graphical model, such as a simulation engine or a processor, may proceed to evaluate a second subsystem 405 or insert a selector block.

In an embodiment, at least one subsystem 405 of a graphical model can be evaluated without locating a routing path or potential routing path. In this example, blocks 410 may be added to the graphical model to complete or create any such path. Once a potential path is found, the modeling environment may present it to the user, and/or it may continue the evaluation to identify at least one additional path. Depending on a particular implementation, all paths or a subset of the paths may be displayed to a user. Locating potential paths may be accomplished in parallel on different processing elements, such as processor cores. Locating potential paths may also be accomplished in the background as the user is editing a model. Suggestions of the alternative paths may be provided to a user during model editing.

In an embodiment, a connection may be found between a graphical and/or logical source and a graphical and/or logical destination. In order to identify a routing path, one or more bus selectors in the destination subsystem may be found. The bus content for these bus selectors may be recursively loaded and logic associated with the model may walk up through the bus structures to one or more graphical sources. Traversing the bus structure may be accomplished using a graph traversal algorithm, or linear programming algorithms, interior point optimizations, etc. Blocks 410 and/or ports 415 may be added as required to complete the routing path.

In an embodiment, geometric considerations may be taken into account during creation or moving of line segments. The geometry of lines in proximity of the line that is added or moved may be used to derive geometry of the added or moved line. For example, if a right angle is required to make a connection, the location of this angle may be aligned in the horizontal or vertical direction with the location of an angle in another line. This line may be considered if it is nearby or because it may connect to a block or a subsystem that the added or moved line connects to. The geometry of blocks in the line proximity and the location of ports may likewise be considered. For example, the point of a right angle in a line may be aligned in the horizontal or vertical direction with one of the edges of a rectangular block or other landmark geometric criterion such as a maximum or minimum value of an outline. As another example, point of a right angle may be aligned in the horizontal or vertical direction with the location of a port, for example a port (input or output port) that the line connects to. Similar to use of angles, line or curve characteristics may be used. For example, Bezier points may be considered in making a geometric connection.

Exemplary Processing

Figure 7:
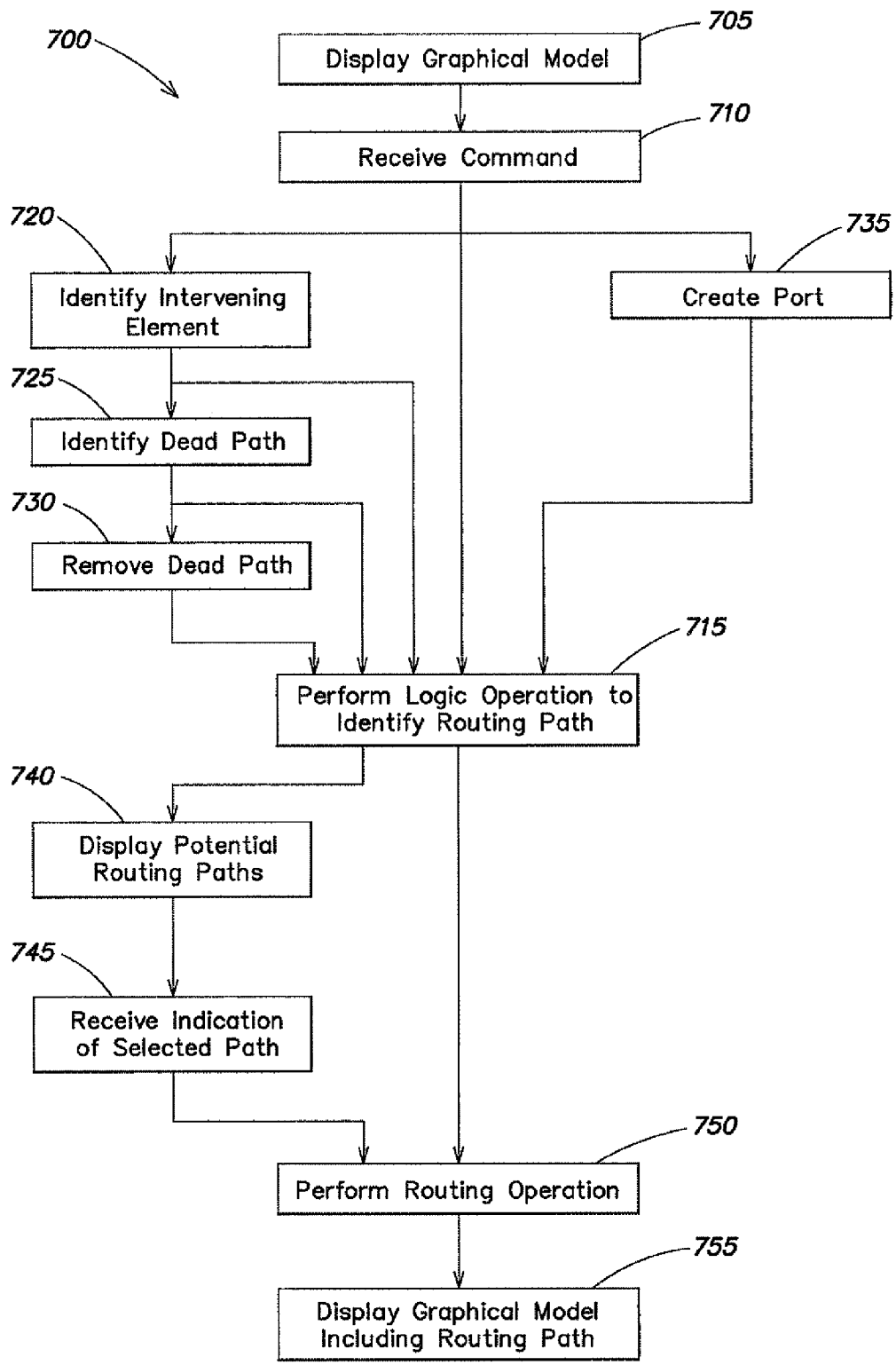
FIG. 7 illustrates exemplary processing that can be used with an exemplary embodiment.

FIG. 7 illustrates a computer implemented method 700 in accordance with an embodiment. One embodiment of method 700 may include displaying a graphical model (ACT 705). Generally, displaying a graphical model (ACT 705) may include displaying a plurality of elements that represent a modeled system.

Displaying a graphical model (ACT 705) can also include representing a modeled system having multiple layer hierarchies. For example, a layer may be represented as a block of a graphical model, and a plurality of elements may exist within the block. Displaying a graphical model (ACT 705) can also include displaying signal and bus lines.

An embodiment of method 700 may include receiving a command or request to connect at least one block of a modeled system with at least one signal or a bus line (ACT 710). Receiving a command (ACT 710) can include receiving a request to connect a first block and a second block with a signal. For example, a user (e.g., a programmer, developer, etc.), may manipulate a graphical model via a graphical user interface (GUI). In this example, the user may add an element to the graphical model. This element may include a signal or input, or a logic operation represented by a block. In one embodiment, receiving a command (ACT 710) may include receiving a command or request from the user to connect at least one block of a graphical model with a signal. Receiving a command (ACT 710) may include receiving a command to route a signal from a source to a destination. This may include receiving a command (ACT 710) to route a signal through one or more hierarchical layers of the graphical model from a first block to a second block. In one embodiment, this can include a request to route a signal from an input, port, block, or bus line to any other block in the model.

A new element may be introduced at one hierarchical layer of the graphical model and enable communicating of data with a destination at another layer. Depending on the layout of the model, a user may be unwilling or unable to route the signal from the source to the destination. For example, the routing path of a signal between two or more blocks may not be apparent to a user. In some cases, a user may be able to locate a routing path by hand, but it may be more convenient to allow the modeling environment to do so. In this example, computer implemented method 700 may receive a command (ACT 710) to connect a signal from one point in the graphical model to another point in the graphical model. It should be appreciated that various graphical models may include a plurality of potential routing paths that could connect two blocks of a graphical model with a signal, and that some routing paths may offer advantages over other routing paths. For example, some routing paths may be more direct, efficient, or functionally more desirable representations of a modeled system. In an embodiment, a user may request that a signal be routed without providing further detail regarding a routing path in the graphical model. For example, a user may identify a signal and at least one block that the signal may be routed to or from, and instruct computer implemented method 700 to rout or connect the signal to or from a source or destination. An embodiment of method 700 may include performing a logic operation (ACT 715) to identify a routing path between blocks of a graphical model. A command may be received (ACT 710) to connect a first block and a second block with a signal, where the signal is introduced at the first block and is to be processed at a second block. Performing a logic operation (ACT 715) may include identifying a routing path from a plurality of potential routing paths. A routing path may be mapped through or otherwise pass through at least one subsystem so that the subsystem forms part of the routing path configured to logically connect the first and second blocks.

Performing a logic operation (ACT 715) to identify a routing path can include identifying a first set of potential routing paths and identifying a second set of potential routing paths. This identification may be done by representing a model as a graph in an internal representation, and using a graph search algorithm to identify at least one set of potential routing paths between blocks of a graphical model. A graph search algorithm may be one of a number of tree or graph search algorithms known to one of skill in the art. For example, performing a logic operation (ACT 715) may include identifying a first set of potential routing paths in part by starting with a source block associated with signal input, and walking through connected blocks and lines until arriving at a destination block. Continuing with this example, performing a logic operation (ACT 715) may also include walking in the opposite direction, i.e., from the destination block to the source block to identify a second set of potential routing paths. In this example, performing a logic operation (ACT 715) may also include identifying points of convergence between the first and second sets of potential routing paths. This generally includes at least partial overlap in portions of the two sets of potential routing paths. For example, a potential routing path from both the first and second sets of potential routing paths may converge at a block. In this illustrative embodiment, performing a logic operation to identify a routing path (ACT 715) can include evaluating points of convergence between any potential routing paths from any set of potential routing paths. It should be appreciated that other logic operations or algorithms may be implemented to identify, determine, or create potential routing paths.

In one embodiment, performing a logic operation to identify a routing path (ACT 715) includes selecting a routing path from a plurality of potential routing paths. Identifying a routing path may also include selecting a routing path that is mapped through at least one subsystem of the modeled system, where the routing path is configured to logically connect blocks that may be located in different hierarchical layers of the modeled system. In one embodiment, identifying a routing path (ACT 715) includes identifying potential routing paths where a potential routing path at least partially overlaps with another potential routing path. Identifying potential routing paths (ACT 715) may include identifying potential routing paths that pass through different hierarchical layers of a graphical model, or that pass through various subsystems of the graphical model at one or more hierarchical layers of the graphical model.

Selecting a routing path may also include receiving an indication of a selected routing path where a routing path to be selected is identified by a user. In one embodiment, selecting a routing path can include identifying a single routing path from a plurality of potential routing paths that is to be used to form a logical connection between blocks of a graphical model, or that is to route a signal to at least one block of a graphical model. In one embodiment, selecting a routing path includes selecting a routing path that passes through at least one subsystem. In another embodiment, selecting a routing path includes selecting a routing path that passes through one or more than one hierarchical levels of a graphical model.

One embodiment of method 700 may include identifying a number of intervening elements (ACT 720). Identifying intervening elements (ACT 720) may include identifying blocks logically located between a first block and a second block of any routing path or potential routing path. Identifying intervening elements (ACT 720) can include determining a number of blocks logically located between two blocks of the graphical model. For example, identifying intervening elements (ACT 720) may include determining a number of blocks associated with each of a plurality of potential routing paths between two blocks that are to be connected to a signal. In this example, performing a logic operation to identify a routing path (ACT 715) may include identifying the routing path as one of the plurality of paths having a least number of blocks. In other words, identifying intervening elements (ACT 720) may include, for example, determining that one potential routing path has five blocks, and that another potential routing path has seven blocks. In this example, identifying a routing path (ACT 715) may include identifying the potential routing path having five blocks as the routing path. These blocks could be weighed according to their type so that, for example, some blocks can be marked less desirable as intervening blocks than others.

An embodiment of method 700 includes identifying at least one dead path (ACT 725). Generally, identifying a dead path (ACT 725) may include identifying a dead path logically connected to at least one block. Identifying a dead path (ACT 725) may also include identifying an inactive, unused, dangling, or incomplete path that may not be associated with logic operations of the graphical model. For example, in a model where a first block and a second block are to be connected to a signal, identifying a dead path (ACT 725) may include locating a path associated with one of the first block and the second block. In this example, identifying an incomplete path (ACT 725) includes identifying a path that does not complete a logical connection between the first block and the second block, and through which a signal may not be routed.]

An embodiment of method 700 may include removing the dead path from the graphical model (ACT 730). The potential path to be removed may be presented to the user for approval of removal, or removal may be performed automatically as part of exploring the model in order to identify potential routing paths.

Dead paths may interfere with the performance of the graphical model by, for example, performing superfluous logic operations that may not be utilized by other blocks of the graphical model. Dead paths may also clutter the visual display of the graphical model. Removing the dead path from the graphical model (ACT 730) may include deleting the dead path from the graphical model. In this example, blocks, lines, subsystems, or other elements forming all or part of a dead path may be deleted from the graphical model, and any logic operations associated with dead path elements may no longer be performed.

Performing a logic operation to identify a routing path (ACT 715) may include creating a routing path. For example, a routing path between blocks may not exist, or an existing routing path may include a high number of intervening blocks and thus be inefficient. Locating a potential path may include an act of creating or proposing creation of at least one port (ACT 735). Creating at least one port (ACT 735) may include inserting or including a port in the graphical model. For example, a potential routing path may include a block that does not input or output a signal. In this example, creating a port (ACT 735) and associating the port with a block can enable the block to receive, carry, or transmit a signal along a routing path or potential routing path. In an embodiment, creating a port (ACT 735) does not require user input or consent. For example creating a port (ACT 735) can include automatically inserting a port into the graphical model in response to receiving a command to connect a block with a signal (ACT 710). In other words, creating a port (ACT 735) may create a potential routing path associated with at least one block of a graphical model.

Various embodiments of method 700 may include displaying the plurality of potential routing paths (ACT 740) and receiving a selection of at least one routing path (ACT 745). As discussed, performing a logic operation to identify a routing path (ACT 715) may include identifying a plurality of potential routing paths. The one or more of the plurality of potential reference paths can be displayed (ACT 740) to a user who may then designate at least one of the potential routing paths as the routing path. For example, displaying a plurality of potential routing paths (ACT 740) can include displaying the graphical model where each routing path is highlighted or otherwise distinguished so that a user may follow a potential routing path to or from at least one block or signal. This may include displaying potential reference paths in a particular color, font, or style so that they may be recognized.

Receiving a selection of at least one routing path (ACT 745) may include receiving a selection of a routing path from a user. For example, a user may click on a potential routing path displayed on a GUI to indicate the user's selection of that routing path. A selection of a routing path from a plurality of displayed potential routing paths may be received (ACT 745) in a manner similar to the manner in which the command to connect at least one block to a signal is received (ACT 710). Alternatively, a path may be automatically selected. In order to implement a potential path, a routing operation may be performed (ACT 750). Performing a routing operation (ACT 750) may include logically connecting at least one block with a signal, bus line or other lines via the routing path. For example, performing a routing operation (ACT 750) may include processing a signal in a graphical model. In another embodiment, performing a routing operation (ACT 750) can include implementing logic operations associated with a signal by connecting it to at least one block. Performing a routing operation (ACT 750) may generally include logically coupling a signal with a series of blocks that form a routing path so that the signal can be processed by the graphical model. In one embodiment, performing a routing operation (ACT 750) enables signal travel via a routing path and signal processing by, for example, blocks associated with the routing path. In one embodiment, performing a routing operation (ACT 750) includes logically connecting, in a graphical model, a first block and a second block via a routing path. For example, this may include logically connecting a signal with at least one block via the routing path identified in the selecting act (ACT 715).

Once the routing path is identified, the graphical model may be presented including the routing path (ACT 755). A routing path may be added to a graphical model, and as such may form part of the graphical model so that a display of the graphical model includes a display of a routing path associated with the graphical model.

Once the routing path is found, the model is displayed including the routing path (ACT 705). Multiple sources and destinations may be connected simultaneously using the routing paths that have been found.

It should be appreciated that method 700 may include more or fewer acts than those illustrated in the example of FIG. 7. The order in which acts of method 700 may occur can vary. These acts may occur independently and in any order, and need not depend on the performance of any other act of method 700.

In an embodiment, new ports may be added during identification of a path from one element to another. The ports may be added to subsystems or blocks. For example, new ports may be added to bus creation blocks. Illustrated in FIG. 8 is an exemplary system 809 where port 808 is added as part of identifying a path between block 802 and block 807.

Figure 8:
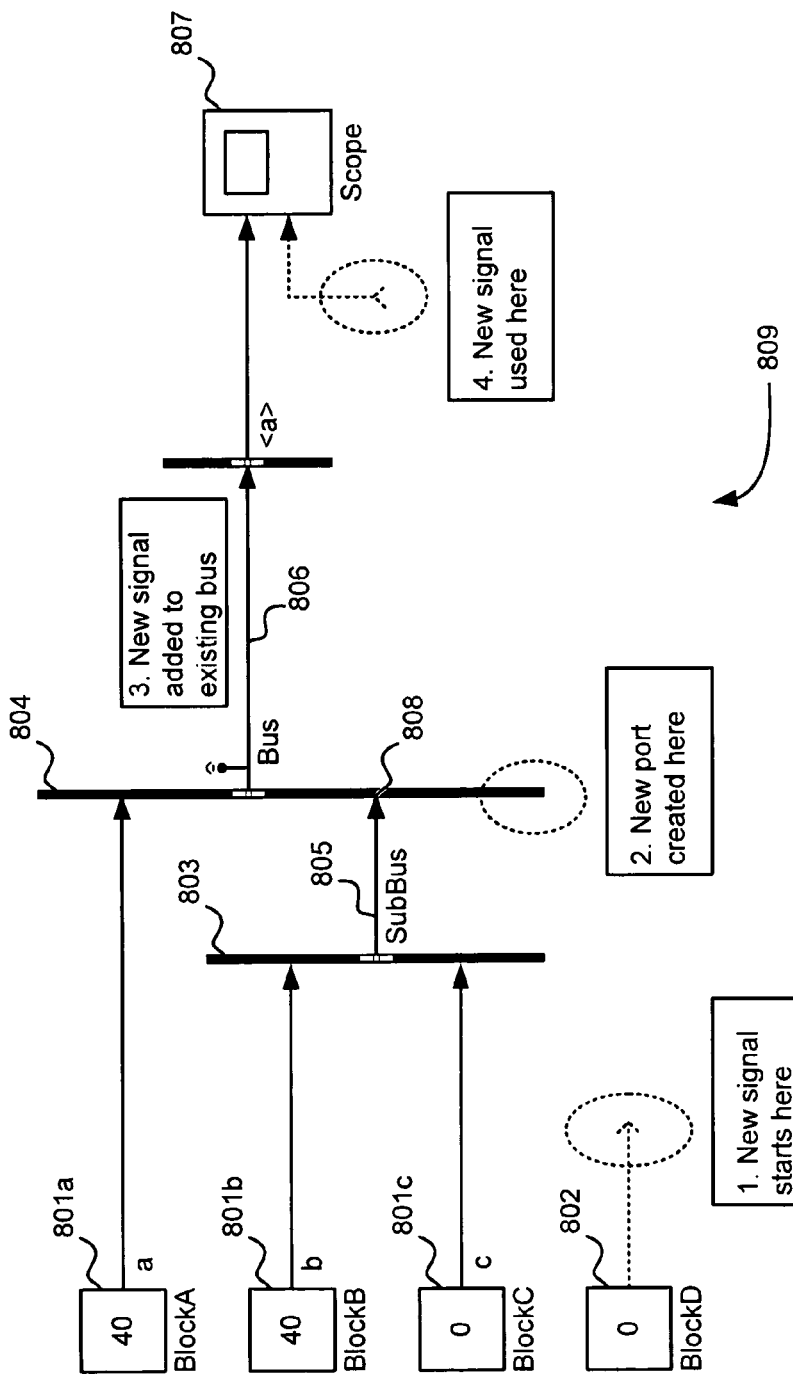
FIG. 8 illustrates adding a port to a graphical diagram.

As shown in FIG. 8, in response to a user command to connect block 802 to block 807, a modeling environment may identify a path that proceeds, at least in portion, through bus 806. In order to include a connection from block 802 in bus 806, a new port may be added to bus creator 804. Alternatively, a port may have been added to bus creator 803, so that the connection would proceed from block 802 through bus 805 to bus creator 808 through bus 806 to block 807. In either to of these cases, connections from blocks 801a-c remain unaffected.

Exemplary Computing Architecture

Figure 9:
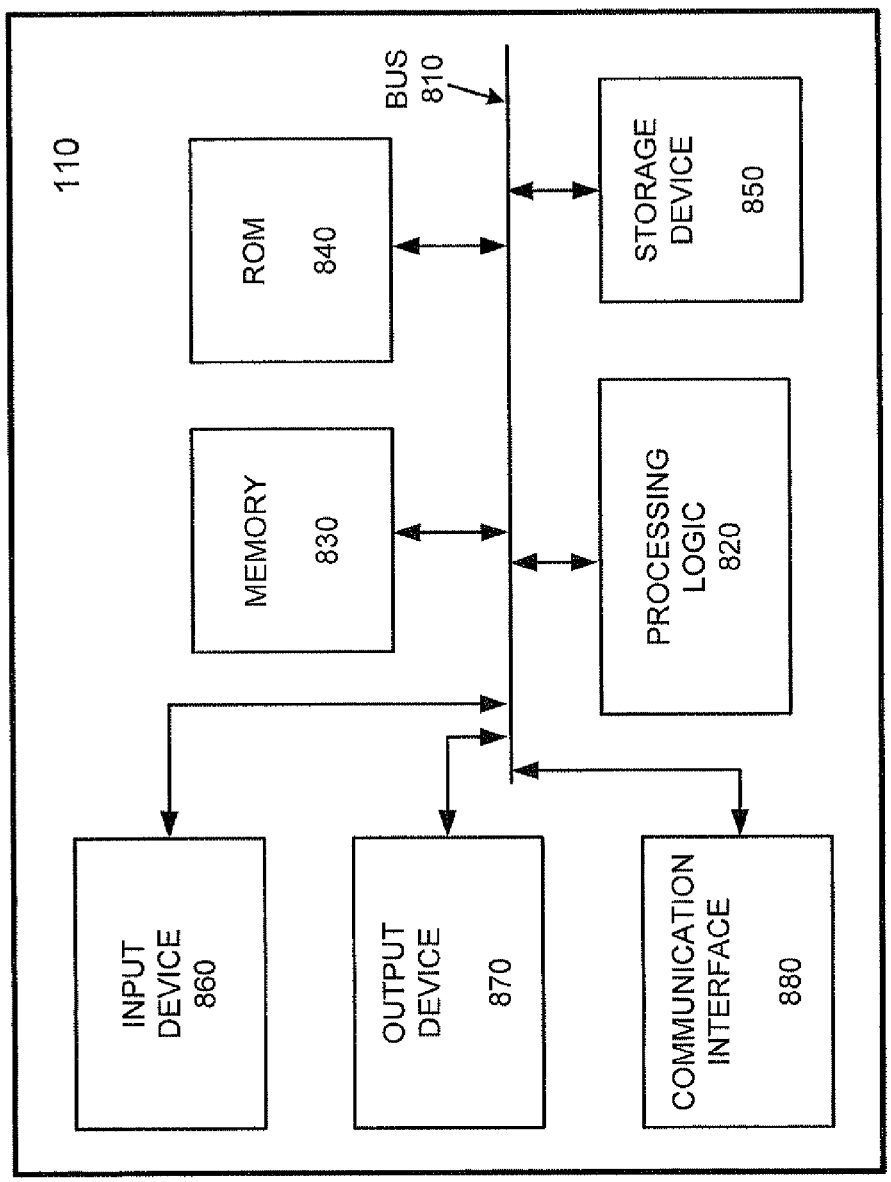
FIG. 9 is a block diagram illustration of an electronic device in accordance with an exemplary embodiment.

FIG. 9 illustrates an exemplary computer architecture that can be used to implement a computing device for practicing exemplary embodiments. FIG. 9 is an exemplary diagram of an entity corresponding to a computing device. As illustrated, the entity may include a communication bus 810, processing logic 820, a main memory 830, a read-only memory (ROM) 840, a storage device 850, an input device 860, an output device 870, and/or a communication interface 880.

Communication bus 810 may permit communication among the components of the entity. Processing logic 820 may include a processor, microprocessor, or other types of processing logic that may interpret and execute instructions. In one implementation, processing logic 820 may include a single core processor or a multi-core processor. In another implementation, processing logic 820 may include a single processing device or a group of processing devices, such as a processor cluster or computing grid. In still another implementation, processing logic 820 may include multiple processors that may be local or remote with respect each other, and may use one or more threads while processing. In yet another implementation, processing logic 820 may comprise heterogeneous computational elements such as signal processing elements, graphics processing elements, general purpose processing elements, etc.

Main memory 830 may include a random access memory (RAM) or another type of dynamic storage device that may store information and instructions for execution by processing logic 820. ROM 840 may include a ROM device or another type of static storage device that may store static information and/or instructions for use by processing logic 820. Storage device 850 may include a magnetic, solid state and/or optical recording medium and its corresponding drive, or another type of static storage device that may store static information and/or instructions for use by processing logic 820.

Input device 860 may include logic that permits an operator to input information to the entity, such as a keyboard, a mouse, a pen, a touchpad, an accelerometer, a microphone, voice recognition, camera, neural interface, biometric mechanisms, etc. Output device 870 may include a mechanism that outputs information to the operator, including a display, a printer, a speaker, a haptic device, etc. Communication interface 880 may include any transceiver-like logic that enables the entity to communicate with other devices and/or systems. For example, communication interface 880 may include mechanisms for communicating with another device or system via a network.

The entity depicted in FIG. 9 may perform certain operations in response to processing logic 820 executing software instructions contained in a computer-readable medium, such as main memory 830. A computer-readable medium may be defined as a physical or logical memory device. The software instructions may be read into main memory 830 from another computer-readable storage medium, such as storage device 850, or from another device via communication interface 880. The software instructions contained in main memory 830 may cause processing logic 820 to perform processes described herein when the software instructions are executed on processing logic. Alternatively, hardwired circuitry may be used in place of or in combination with software instructions to implement processes described herein. Thus, implementations described herein are not limited to any specific combination of hardware circuitry and software.

Although FIG. 9 shows exemplary components of the entity, in other implementations, the entity may contain fewer, different, or additional components than depicted in FIG. 9. In still other implementations, one or more components of the entity may perform one or more tasks described as being performed by one or more other components of the entity.

CONCLUSION

Implementations may provide devices and techniques that identify a routing path in a graphical model or graphical program representation that connects at least one block with other blocks or signals. These devices and techniques can perform logic operations to connect one or more blocks with each other or with a signal via the routing path. Embodiments of these devices and techniques allow for automatic detection and routing of a signal via one routing path that may be selected from a plurality of potential routing paths.

The foregoing description of example embodiments of the invention provides illustration and description, but is not intended to be exhaustive or to limit the invention to the precise form disclosed. Modification and variations are possible in light of the above teachings or may be acquired from practice of the invention. For example, while a series of acts has been described with regard to FIG. 7, the order of the acts maybe modified in other implementations consistent with the principles of the invention. Further, non-dependent acts may be performed in parallel.

In addition, implementations consistent with principles of the invention can be implemented using devices and configurations other than those illustrated in the figures and described in the specification without departing from the spirit of the invention. Devices and/or components may be added and/or removed from the implementations of the Figures depending on specific deployments and/or applications. Further, disclosed implementations may not be limited to any specific combination of hardware.

Further, certain portions of the invention may be implemented as logic that performs one or more functions. This logic may include hardware, such as hardwired logic, an application-specific integrated circuit, a field programmable gate array, a microprocessor, software, wetware, or a combination of hardware and software.

No element, act, or instruction used in the description of the invention should be construed as critical or essential to the invention unless explicitly described as such. Also, as used herein, the article "a" is intended to include one or more items. Where only one item is intended, the term "one" or similar language may be used. Further, the phrase "based on" as used herein is intended to mean "based, at least in part, on" unless explicitly stated otherwise. Also, the phraseology and terminology used herein is for the purpose of description and should not be regarded as limiting. The use of "including" "comprising" "having" "containing" "involving" and variations thereof herein, is meant to encompass the items listed thereafter and equivalents thereof as well as additional items. References to "or" may be construed as inclusive so that any terms described using "or" may indicate any of a single, more than one, and all of the described terms.

Any embodiment disclosed herein may be combined with any other embodiment, and references such as "an embodiment", "some embodiments", "an alternate embodiment", "various embodiments", "one embodiment" or the like are not necessarily mutually exclusive and are intended to indicate that a particular feature, element, structure, or characteristic described in connection with the embodiment may be included in at least one embodiment. The appearances of such terms herein are not necessarily all referring to the same embodiment. Any embodiment may be combined with any other embodiment in any manner consistent with the objects, aims, and needs disclosed herein.

One skilled in the art will realize the systems and methods described herein may be embodied in other specific forms without departing from the spirit or essential characteristics thereof. For example, the systems and methods disclosed herein may apply to a wide variety of graphical model environments in addition to block diagrams. This may include state-based or data-flow diagrams, circuit diagrams, mechanical diagrams, network diagrams, or software diagrams. The foregoing embodiments are therefore to be considered in all respects illustrative rather than limiting of the described systems and methods. Scope of the systems and methods described herein is thus indicated by the appended claims, rather than the foregoing description, and all changes that come within the meaning and range of equivalency of the claims are therefore intended to be embraced therein.

The scope of the invention is defined by the claims and their equivalents.

What is claimed is:

1. A non-transitory computer readable medium storing instructions, the instructions comprising:
one or more instructions that, when executed by one or more processors, cause the one or more processors to:
provide, for display, a graphical model representing a modeled system,
the graphical model comprising a plurality of elements,
the plurality of elements including an originating block and a terminating block, and
the originating block being located on a different hierarchical layer of the graphical model than the terminating block,
receive a request to connect the originating block to the terminating block,
use, based on the request, an algorithm to:
identify a first potential routing path,
the first potential routing path:
starting at the originating block, and
ending at the terminating block, and
identify a second potential routing path,
the second potential routing path:
starting at the originating block, and
ending at the terminating block,
attribute a first value to one or more first particular elements, of the plurality of elements, that are within the first potential routing path based on one or more weights associated with the one or more first particular elements,
attribute a second value to one or more second particular elements, of the plurality of elements, that are within the second potential routing path based on one or more weights associated with the one or more second particular elements,
identify a routing path, of the first potential routing path and the second potential routing path, based on the first value and the second value,
the routing path being configured to connect the originating block with the terminating block, and
connect, in the graphical model, the originating block with the terminating block via the routing path.

2. The non-transitory computer readable medium of claim 1, where the one or more instructions to identify the first potential routing path comprise:
one or more instructions that, when executed by the one or more processors, cause the one or more processors to identify a logical connection or a graphical connection between the originating block and the terminating block.

3. The non-transitory computer readable medium of claim 1, where the graphical model is an executable graphical diagram.

4. The non-transitory computer readable medium of claim 1, where the instructions further comprise:
one or more instructions that, when executed by the one or more processors, cause the one or more processors to:
create, based on the request, at least one port associated with the plurality of elements, and
where the one or more instructions to use the algorithm further comprise:
one or more instructions that, when executed by the one or more processors, cause the one or more processors to:
perform a routing operation to logically or graphically connect the originating block and the terminating block via the at least one port.

5. The non-transitory computer readable medium of claim 1, where the one or more instructions to identify the routing path comprise:
one or more instructions that, when executed by the one or more processors, cause the one or more processors to:
aggregate at least a portion of a connection between the originating block and the terminating block into an aggregate connection, and
identify the routing path further based on the aggregate connection.

6. The non-transitory computer readable medium of claim 5, where the one or more instructions to aggregate the at least the portion of the connection between the originating block and the terminating block into the aggregate connection comprise:
one or more instructions that, when executed by the one or more processors, cause the one or more processors to:
add the at least the portion of the connection between the originating block and the terminating block into an existing bus line or an existing assembly connector.

7. The non-transitory computer readable medium of claim 5, where the one or more instructions to aggregate the at least the portion of the connection between the originating block and the terminating block into the aggregate connection comprise:
one or more instructions that, when executed by the one or more processors, cause the one or more processors to: create a new bus line or a new assembly connector.

8. The non-transitory computer readable medium of claim 1,
where the first potential routing path is configurable to logically connect at least one of the originating block and the terminating block with a signal via at least one of a plurality of ports, and
where the second potential routing path includes at least one port created based on the request.

9. The non-transitory computer readable medium of claim 1, where the instructions further comprise:
one or more instructions that, when executed by the one or more processors, cause the one or more processors to: determine a number of intervening elements logically located between the originating block and the terminating block for the first potential routing path, and
where the one or more instructions to identify the routing path include:
one or more instructions that, when executed by the one or more processors, cause the one or more processors to:
identify the routing path further based on an optimization consideration related to the number of intervening elements.

10. The non-transitory computer readable medium of claim 1,
where the one or more instructions to identify the routing path include:
one or more instructions that, when executed by the one or more processors, cause the one or more processors to:
identify the routing path further based on an optimization consideration related to the first potential routing path, and
where the optimization consideration is at least one of:
a number of intervening elements in the first potential routing path,
types of intervening elements in the first potential routing path, or
connectivity of intervening elements in the first potential routing path.

11. The non-transitory computer readable medium of claim 1, where the instructions further comprise:
one or more instructions that, when executed by the one or more processors, cause the one or more processors to:
identify a plurality of intervening elements logically or graphically located between the originating block and the terminating block for the first potential routing path, and
receive a command to include, in the routing path, at least one of the plurality of intervening elements, and
where the one or more instructions to identify the routing path include:
one or more instructions that, when executed by the one or more processors, cause the one or more processors to:
identify the routing path further based on the command to include the at least one of the plurality of intervening elements.

12. The non-transitory computer readable medium of claim 1, where the instructions further comprise:
one or more instructions that, when executed by the one or more processors, cause the one or more processors to:
determine a plurality of points of convergence between the first potential routing path and the second potential routing path, and
evaluate the points of convergence, and
where the routing path is identified further based on evaluating the points of convergence.

13. The non-transitory computer readable medium of claim 1, where the instructions further comprise:
one or more instructions that, when executed by the one or more processors, cause the one or more processors to:
provide, for display, the first potential routing path and the second potential routing path.

14. The non-transitory computer readable medium of claim 1, where the at least one hierarchical layer is a subchart of the graphical model.

15. A computer system comprising:
a processor to:
receive a graphical program representation,
the graphical program representation including a plurality of elements,
the plurality of elements including an originating block and a terminating block,
the originating block being located on a first hierarchical layer of the graphical program representation, and
the terminating block being located on a second hierarchical layer of the graphical program representation,
receive a request to connect the originating block to the terminating block,
use, based on the request, an algorithm to identify a first set of potential routing paths and a second set of potential routing paths,
the first set of potential routing paths starting at the originating Block and ending at the terminating block, and
the second set of potential routing paths starting at the terminating block and ending at the originating block,
identify, based on weights used to attribute value to one or more particular elements of the plurality of elements, a routing path from the first set of potential routing paths and the second set of potential routing paths,
the routing path logically connecting the originating block and the terminating block; and
provide, for display, the routing path of the graphical program representation.

16. The computer system of claim 15,
where the processor is further to:
create, based on the request, at least one routing port associated with the plurality of elements, and
where, when identifying the routing path, the processor is further to:
identify, as the routing path, a path including the at least one routing port.

17. The computer system of claim 15,
where the routing path includes a plurality of points of convergence, and
where, when identifying the routing path, the processor is further to:
evaluate the plurality of points of convergence to identify the routing path.

18. The computer system of claim 15, where the terminating block includes at least one of:

two or more other blocks,
a subsystem, or
a port.

19. The computer system of claim 15,
where the processor is further to:
receive information associated with a selection of a port that forms a part of the routing path, and
where, when identifying the routing path, the processor is to:
identify the routing path further based on the selection of the port.

20. The computer system of claim 15,
where at least one portion of the routing path includes a connection from the first hierarchical layer to the second hierarchical layer.

21. A method comprising:
receiving a command to connect a first block, of a model representing a modeled system, to a second block of the model,
the first block and the second block being in different hierarchical layers of the model, and
receiving the command being performed by a computer;
identifying, using a graph search algorithm, a first set of potential routing paths and a second set of potential routing paths,
the first set of potential routing paths starting at the first block and ending at the second block,
the second set of potential routing paths starting at the second block and ending at the first block, and
identifying the first set of potential routing paths and the second set of potential routing paths being performed by the computer;
identifying, from the first set of potential routing paths and the second set of potential routing paths, a routing path between the first block and the second block based on weights used to attribute values to one or more elements of the model, in the routing path,
identifying the routing path being performed by the computer;
performing a routing operation to logically connect the first block and the second block via the routing path,
performing the routing operation being performed by the computer; and
providing, for display, the routing path,
providing the routing path for display being performed by the computer.

22. A non-transitory computer readable medium storing instructions, the instructions comprising:
one or more instructions that, when executed by one or more processors, cause the one or more processors to:
provide, for display, a graphical model representing a modeled system,
the graphical model including a first block and a second block,
receive a request to connect the first block and the second block with a signal,
represent the graphical model as a graph based on receiving the request,
use, based on the graph, a graph search algorithm to identify a first set of potential routing paths and a second set of potential routing paths,
the first set of potential routing paths starting at the first block and ending at the second block,
the second set of potential routing paths starting at the second block and ending at the first block, and
the first set of potential routing paths and the second set of potential routing paths forming a group of potential routing paths,
identify, based on weights used to attribute value to one or more elements of the model that are within each potential routing path of the group of potential routing paths, a routing path from the group of potential routing paths, and
the third element being an intervening element on the routing path, and
connect, in the graphical model, the first block to the second block via the routing path.

23. The non-transitory computer readable medium of claim 22, where the one or more instructions to identify the routing path comprise:
one or more instructions that, when executed by the one or more processors, cause the one or more processors to:
identify the routing path further based on a quantity of layers of the graphical model that a particular potential routing path, of the group of potential routing paths, passes through.

24. The non-transitory computer readable medium of claim 22,
where the first block includes a first sub-system of the graphical model, and
where the second block includes a block of a second sub-system of the graphical model.

25. The non-transitory computer readable medium of claim 22,
where the first block is located on a first hierarchical layer of the graphical model,
where the second block is located on a second hierarchical layer of the graphical model, and
where the first hierarchical layer is different from the second hierarchical layer.

\* \* \* \* \*